United States Patent
Dishongh et al.

(12) 
(10) Patent No.: US 6,630,631 B1
(45) Date of Patent: Oct. 7, 2003

(54) APPARATUS AND METHOD FOR INTERCONNECTION BETWEEN A COMPONENT AND A PRINTED CIRCUIT BOARD

(75) Inventors: Terrance J. Dishongh, Hillsboro, OR (US); Carolyn R. McCormick, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/108,219

(22) Filed: Mar. 27, 2002

(51) Int. Cl.$^7$ .................. H05K 1/11; H01R 12/04
(52) U.S. Cl. .............. 174/262; 174/260; 29/852; 29/853
(58) Field of Search ............. 174/260, 262–266; 29/846–853

(56) References Cited

U.S. PATENT DOCUMENTS

| | | | |
|---|---|---|---|
| 5,399,898 A | * | 3/1995 | Rostoker .............. 257/499 |
| 5,880,030 A | | 3/1999 | Fang et al. |
| 6,020,561 A | | 2/2000 | Ishida et al. |
| 6,274,821 B1 | * | 8/2001 | Echigo et al. ........... 174/255 |
| 6,335,565 B1 | * | 1/2002 | Miyamoto et al. ....... 257/686 |

OTHER PUBLICATIONS

"Ball Grid Array (BGA) Packaging", Intel 2000 Packaging Databook, Chapter 14, 2000.

"The Chip Scale Package (CSP)", Intel 2000 Packaging Databook, Chapter 15, 2000.

Burgess, Larry W. Introducing Via–In–Pad Blind Via Technology to Any PCB Multilayer Fabricator, Technical Paper S15–2–1, IPC Printed Circuits Expo, San Jose, CA, Mar. 1997.

Wessel, Richard "Polymer Thick Film Via Plug for PCB's and Packaging Applications" Technical Paper S17–4–1, IPC Printed Circuits Expo, Long Beach, CA, Apr. 1998.

* cited by examiner

*Primary Examiner*—David L. Talbott
*Assistant Examiner*—Jeremy Norris
(74) *Attorney, Agent, or Firm*—John F. Travis (57) ABSTRACT

A first signal routing layer may be formed on a first surface of a printed circuit board (PCB). An array of interconnections may formed on the first surface of the PCB, the array of interconnections comprising at least one padless via formed within the PCB, the at least one padless via extending from the first signal routing layer to at least one conductive plane and/or a second signal routing layer. The at least one padless via may be in electrical contact with the at least one conductive plane and/or a conductive trace on the second signal routing layer. A component may be attached to the PCB, with a solder interconnection between the at least one padless via and a contact pad on a bottom surface of the component. The component may be, for example, an electronic component such as a ball grid array (BGA) component or a leadless surface mount component.

24 Claims, 8 Drawing Sheets

Routable Traces Between Interconnections
Trace/Space = 3/3 mils, Trace-Via spacing = 5 mils

| Interconnection | | Component Pitch (mm) | | | |
|---|---|---|---|---|---|
| Type | Diameter (mils) | 0.5 | 0.75 | 0.8 | 1 |
| Padless via | 6 | 1 | 2 | 3 | 4 |
| Padless via | 8 | 0 | 2 | 2 | 4 |
| Padless via | 12 | 0 | 1 | 2 | 3 |
| Padless via | 18 | X | 0 | 1 | 2 |
| Contact Pad | 24 | X | X | 0 | 1 |
| Contact Pad | 32 | X | X | X | 0 |

X = overlap

FIG. 9

APPARATUS AND METHOD FOR INTERCONNECTION BETWEEN A COMPONENT AND A PRINTED CIRCUIT BOARD

FIELD

Embodiments of the present invention relate to printed circuit board (PCB) technology and more particularly to interconnecting a component with a PCB.

BACKGROUND

Figure 1:
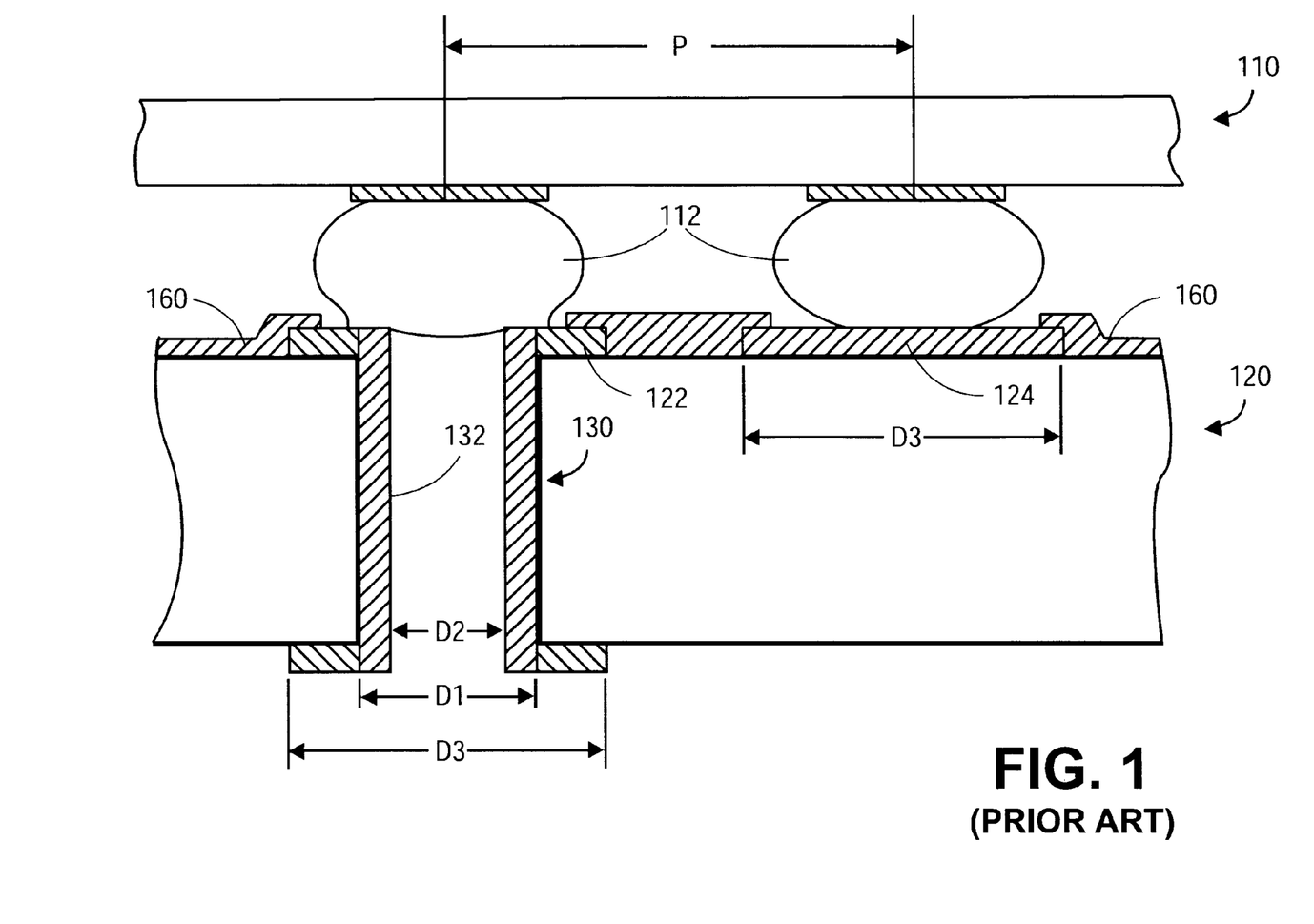
FIG. 1 illustrates a cross-sectional view of a printed circuit board (PCB) with a via according to the prior art.

Within the electronics industry there is a continuing effort to increase device density and speed. As device density increases, the number of interconnections per square inch of an electronic component may increase accordingly. To accommodate an increased number of interconnections, some electronic components are packaged in a ball grid array (BGA) package with an array of solder balls formed on a bottom surface. As illustrated in FIG. 1, a BGA component 110 may be interconnected with a printed circuit board (PCB) 120 by aligning an array of solder balls 112 having an array pitch "P" with a corresponding array of contact pads, such as contact pads 122 and 124, formed on a top surface of the PCB 120. The solder balls 112 may be reflowed to make electrical connections between the solder balls 112 and the contact pads 122 and 124. A layer of solder mask 160 may prevent solder from wicking to adjacent contact pads during reflow.

Typically, the PCB 120 has numerous layers of conductive traces to route signals from the BGA component 110 to other electronic components mounted on both sides of the PCB 120. The PCB 120 may also have a number of vias to route signals from contact pads to the signal routing layers. For example, a signal may travel from the solder ball 112 to the contact pad 122 and through a via 130 to a conductive trace on a bottom surface signal routing layer. The via 130 is typically formed by drilling a hole through the contact pad 122 and plating the drilled hole with a plating material 132. For example, a hole having a diameter D1 from 10–16 mils may be drilled through a contact pad having a diameter D3 from 18–24 mils. To make efficient use of the signal routing area on the PCB 120 beneath the BGA component 110, one or more conductive traces may be routed between adjacent contact pads 122 and 124.

However, as device density increases, the BGA array pitch may shrink and the contact pads may occupy a larger percentage of signal routing area beneath the BGA component which may prevent signal routing between adjacent contact pads. One approach to increase the signal routing area is to reduce the diameter of the contact pads. However, as contact pad diameter decreases, it may become more difficult to drill a via hole through the contact pad due to drill wander and tolerance errors in the drilling process. Errors in the drilling process may lead to non-uniformity in contact pad configuration, which may result in manufacturing errors during assembly of the PCB, and may ultimately lead to scrapping the PCB. Another approach to increase signal routing area is to reduce the width and spacing of conductive traces. However, this approach may require more complicated manufacturing processes which may increase overall PCB cost.

DETAILED DESCRIPTION

In the following description, numerous specific details are set forth such as material types and ranges, in order to provide a thorough understanding of specific embodiments of the present invention. However, it will be obvious to one of skill in the art, that embodiments of the invention may be practiced without these specific details. In other instances, well-known elements and processing techniques have not been shown in particular detail in order to avoid unnecessarily obscuring the understanding of this description.

Embodiments of the present invention may increase signal routing area on a printed circuit board (PCB) by forming vias without contact pads ("padless vias"). An electronic component, such as a ball grid array (BGA) component may be attached to the PCB with solder interconnections between the padless vias and contact pads on a bottom surface of the electronic component. Because padless vias may have a smaller diameter than traditional contact pads, conductive traces may be routed between padless vias and adjacent interconnections even for reduced pitch BGA components, which may reduce a total number of PCB layers needed for signal routing and may reduce overall PCB cost. These conductive traces may have a standard width and spacing which may further reduce overall PCB cost.

Figure 2:
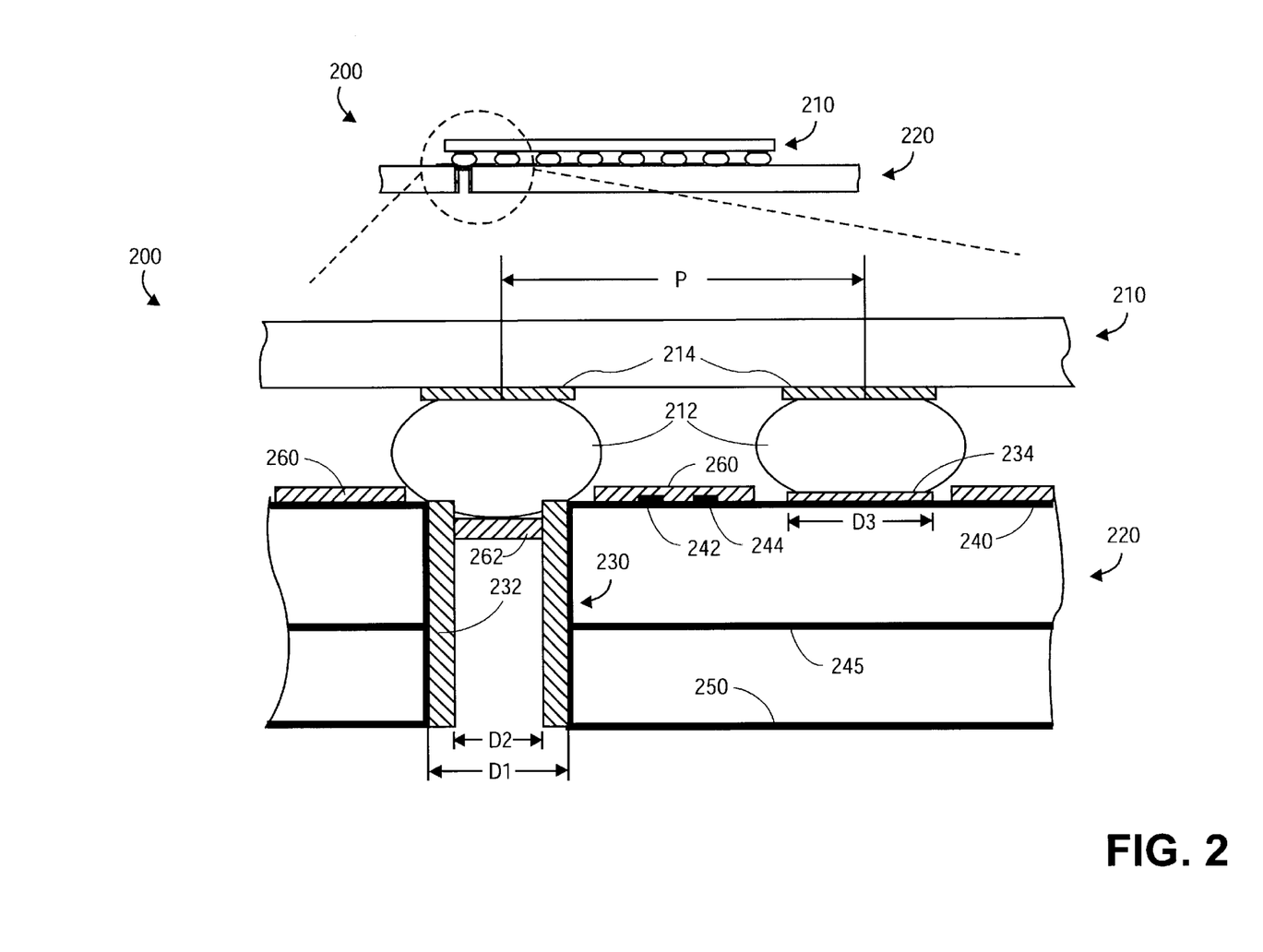
FIG. 2 illustrates a cross-sectional view of an exemplary system comprising a PCB according to one embodiment of the present invention.

FIG. 2 illustrates an exemplary system 200, according to one embodiment of the present invention, comprising a component 210 mounted on a PCB 220. A padless via 230 and an adjacent contact pad 234 may be formed on a top surface of the PCB 220. The padless via 230 and the contact pad 234 may be collectively referred to as interconnections. The padless via 230 and the contact pad 234 may be part of an array of interconnections that comprise any suitable combination of padless vias 230 and contact pads 234 for electrically coupling the PCB to a corresponding array of contact pads 214 formed on a bottom surface of a component 210.

The component 210 may be, for example, an electronic component, such as a processor, a chipset, a memory, a memory controller, graphics controller, etc., housed in a BGA package or a leadless surface mount package. For one embodiment of the present invention, the PCB 220 may be a computer system motherboard and the component 210 may be a processor. Alternatively, the component 210 may be a socket for mounting an electronic component, such as a BGA socket or a land grid array (LGA) socket.

The PCB 220 may have a number of signal routing layers, such as top surface signal routing layer 240, and one or more conductive planes, such as conductive plane 245. The signal routing layers may have a plurality of conductive traces 242 and 244 to route signals to and from the component 210. The padless via 230 may extend from the top surface signal routing layer 240 to a bottom surface signal routing layer 250. A conductive trace on the bottom surface signal routing layer 250 may be in electrical contact with a plating material 232 formed on an inner surface of the padless via 230. For some embodiments of the present invention, the padless via 230 may be in electrical contact with the conductive plane 245, which may be a power or ground plane.

A layer of solder mask material 260 may be deposited over the top surface signal routing layer 240, with openings to expose the padless via 230 and the contact pad 234. The openings may allow attachment of solder balls 212, which may be used for electrical interconnection with the component 210. The solder mask material 260 may prevent solder from the solder balls 212 from wicking to adjacent interconnections during a reflow process.

Figure 3:
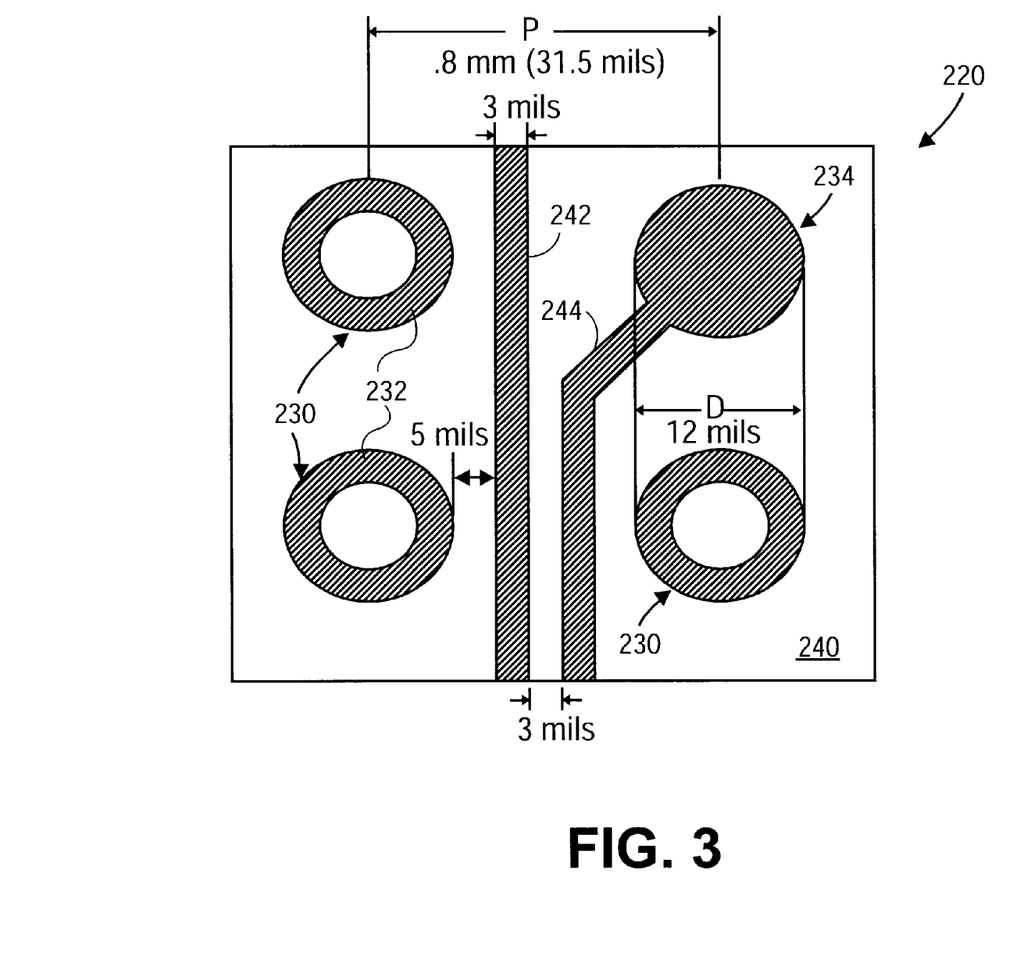
FIG. 3 illustrates a top view of the PCB illustrated in FIG. 2.

FIG. 3 illustrates a top view of the PCB 220 with the layer of solder mask material 260 removed to allow a view of the top surface routing layer 240. As illustrated, the contact pad 234 may be in electrical contact with the conductive trace 244 on the top surface signal routing layer 240. Therefore, a via may not be required to route a signal from the contact pad 234 to another PCB layer and the contact pad 234 may have a smaller diameter D3 than traditional contact pads. For example, while traditional contact pads may be in the range of 18 to 32 mils, the contact pad 234 may have a diameter less than 18 mils because a via will not be drilled through it.

The contact pad 234 may also have a diameter approximately equal to the diameter of the padless via 230, for example, 12 mils. As illustrated, the reduced diameter of the padless vias 230 and the contact pad 234 may allow the conductive traces 242 and 244 to be routed between adjacent interconnections. It should be noted, however, that the dimensions of the padless vias and contact pads shown in FIG. 4 are exemplary only, and embodiments of the present invention may have any suitable combination of padless vias and contact pads arranged in any suitable pattern, for example, corresponding to contact pads of a component to be attached to the PCB.

Figure 4:
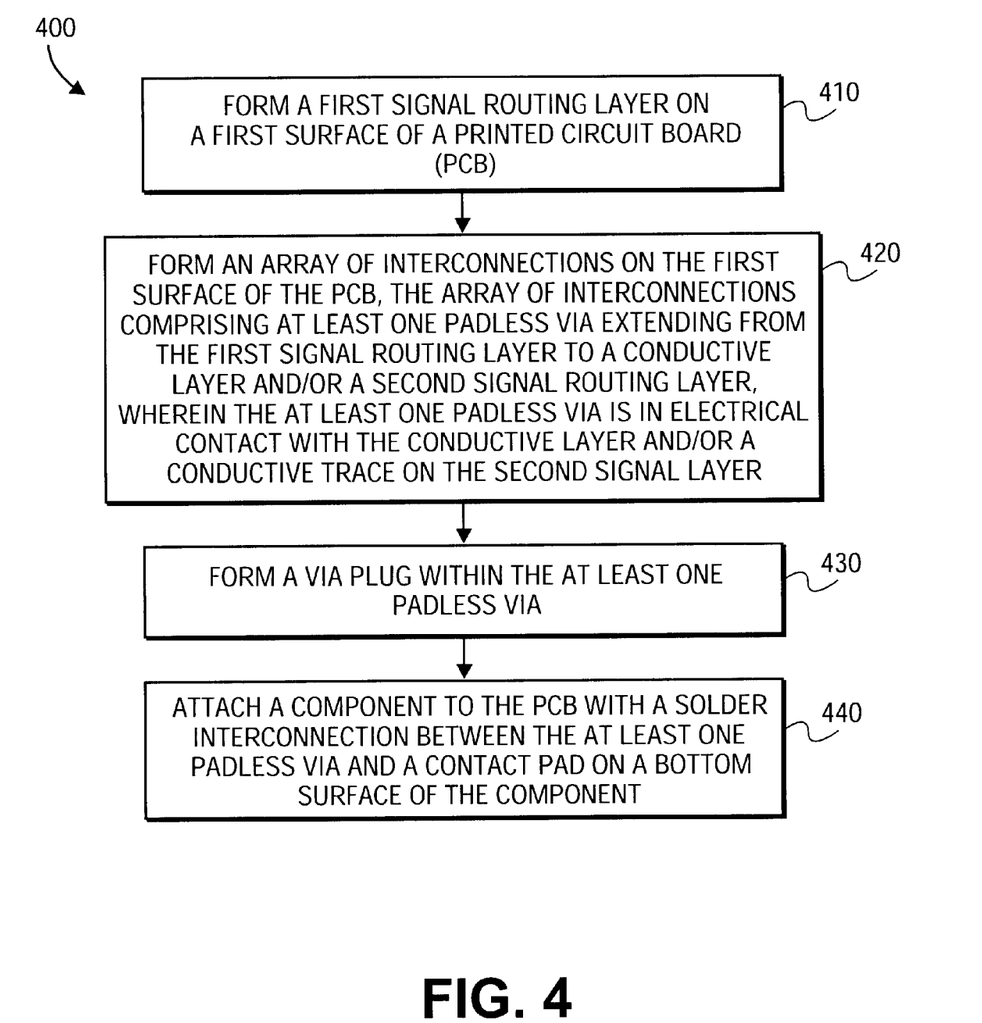
FIG. 4 illustrates a flow diagram of a method to fabricate a PCB according to one embodiment of the present invention.

FIG. 4 illustrates a flow diagram 400 illustrating exemplary operations of a method to fabricate a PCB according to one embodiment of the present invention. For block 410, a first signal routing layer is formed on a first surface of a PCB. The first signal routing layer may be formed by any suitable process. Comment: FIG. 4 shows step 430 as a required plugging step. Note that plugging may not be required.

For block 420, an array of interconnections is formed on the first surface of the PCB, the array of interconnections comprising at least one padless via extending from the first signal routing layer to at least one conductive plane and/or a second signal routing layer, wherein the at least one padless via is in electrical contact with the at least one conductive plane and/or a conductive trace on the second signal routing layer. The array of interconnections may include any suitable combination of contact pads and padless vias, which may be formed by any suitable methods.

For example, referring back to FIG. 2, the padless via 230 may be formed by drilling a hole through the top surface signal routing layer 240 and plating the drilled hole with the plating material 232. Because the hole is not drilled through a contact pad, the padless via 230 may have an outer diameter D1 equal to a diameter of the drilled hole. Any suitable drilling technique may be used, such as mechanical drilling, laser drilling and plasma drilling. Drilled holes having a diameter less than 8 mils may be achieved using such methods. However, as drilling technologies progress, the achievable diameter of drilled holes may decrease.

The drilled hole may be plated according to any suitable method, such as electrodeposition or electroless plating. The plating material 232 may be any suitable conductive material, such as copper or silver, and may be plated to any suitable thickness. For example, a drilled hole having a diameter D1 of 12 mils may be plated with the plating material 232 to a thickness of 1 mil, resulting in the padless via 230 having an inner diameter D2 of 10 mils.

Figure 5:
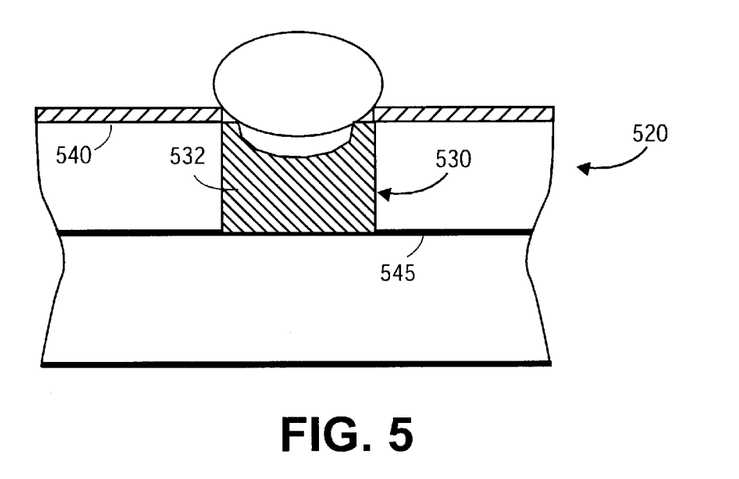
FIG. 5 illustrates a cross-sectional view of a PCB with a blind padless via according to one embodiment of the present invention.

As illustrated, the padless via 230 may extend from the top surface routing layer 240 to the bottom surface routing layer 250. However, as illustrated in FIG. 5, for some embodiments of the present invention, a blind padless via 530 may be formed in a PCB 520 extending from a top surface signal routing layer 540 to an inner layer 545. The inner layer 545 may be an inner signal routing layer or a conductive plane. It may be an advantage that the blind padless via 530 does not extend below inner layer 545, and therefore does not occupy routing area on signal routing layers below inner layer 545.

Forming Via Plugs

Figure 6:
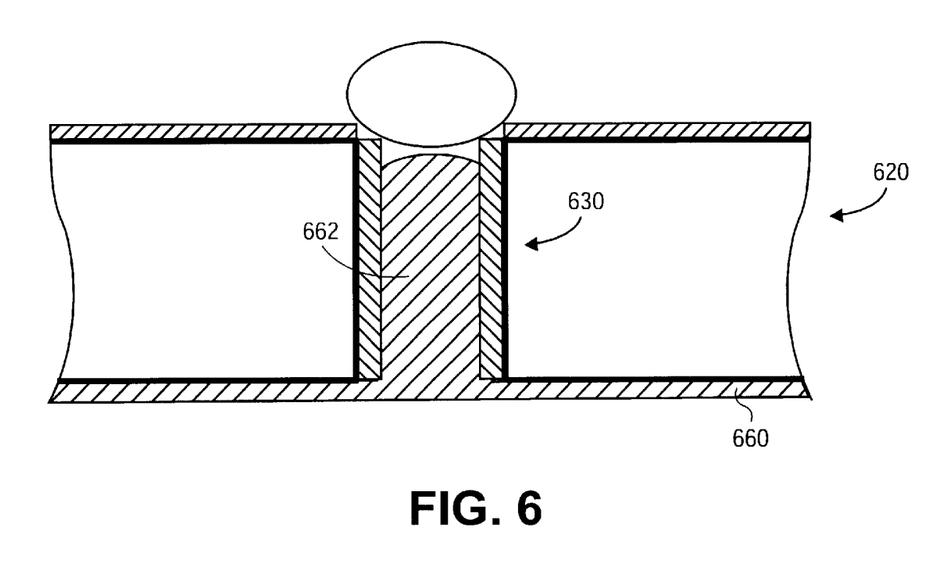
FIG. 6 illustrates a cross-sectional view of a PCB with a padless via with a via plug according to one embodiment of the present invention.

Optionally, for block 430 of FIG. 4, a via plug may be formed in the padless via. For example, as illustrated in FIG. 2, a top-side via plug 262 may prevent solder from solder ball 212 from wicking into the padless via 230 which may leave insufficient solder for electrical connection between the padless via 230 and the contact pad 234. The top-side via plug 262 may be formed by allowing the solder mask material 260 to flow into the padless via 230 during formation of the layer of solder mask. After curing, a top portion of the solder mask material 260 in the padless via may be removed, for example, by laser ablation, leaving the top-side via plug 262. Alternatively, as illustrated in FIG. 6, a via plug 662 may be formed by depositing a solder mask material 660 on a bottom surface of a PCB 620, and allowing the solder mask material 660 to flow into a padless via 630.

Figure 7:
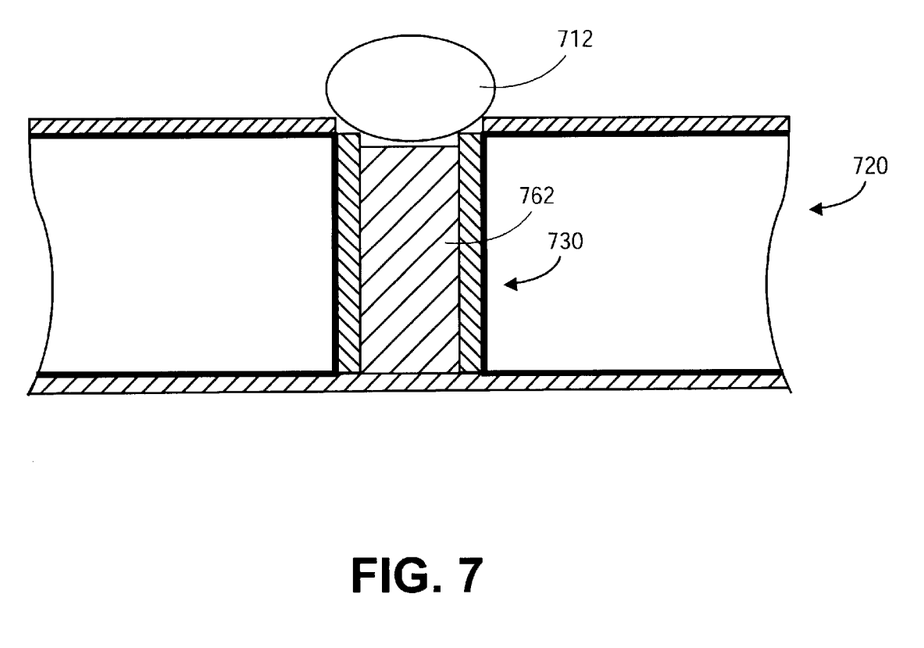
FIG. 7 illustrates a cross-sectional view of a PCB with a padless via with a conductive via plug according to one embodiment of the present invention.

As illustrated in FIG. 7, a conductive via plug 762 may be formed of an electrically conductive material, which may provide a greater conductive surface for electrical connection with a solder ball 712. The conductive via plug 762 may be formed by filling a padless via 730 formed in a PCB 720 with an electrically conductive material, which may be any suitable electrically conductive material, such as a solder or a silver-filled epoxy. Alternatively, as illustrated in FIG. 5, a conductive via plug may be formed by overplating a padless via, such as the blind padless via 530 and removing a top portion of the plating material 532, for example, by etching. Further, for some embodiments of the present invention, padless vias may not require via plugs.

For block 440 of FIG. 4, a component is attached to the PCB, with a solder interconnection between the at least one padless via and a contact pad on a bottom surface of the component. For example, referring back to FIG. 2, the component 210 may be attached to the PCB 220 by aligning solder balls 212 attached to the contact pads 214 of the component 210 with the padless via 230 and the adjacent contact pad 234 and reflowing the solder balls 212 to electrically couple the contact pads 214 to the plating material 232 of the padless vias 230 and the adjacent contact pad 234.

The solder balls 212 may be made of any suitable solder material, such as a common lead-tin alloy. Alternatively, the solder balls 212 may be made of a lead free solder, such as a tin-copper alloy. The solder balls 212 may be reflowed according to any suitable reflow process. For some embodiments of the present invention, in an effort to avoid trapping air, moisture, or gas, which may expand during reflow and create a void or open in a solder joint, a solder ball may be formed with a solder shell solder surrounding a solid center of a material having a higher melting temperature than the solder shell.

Figure 8A:
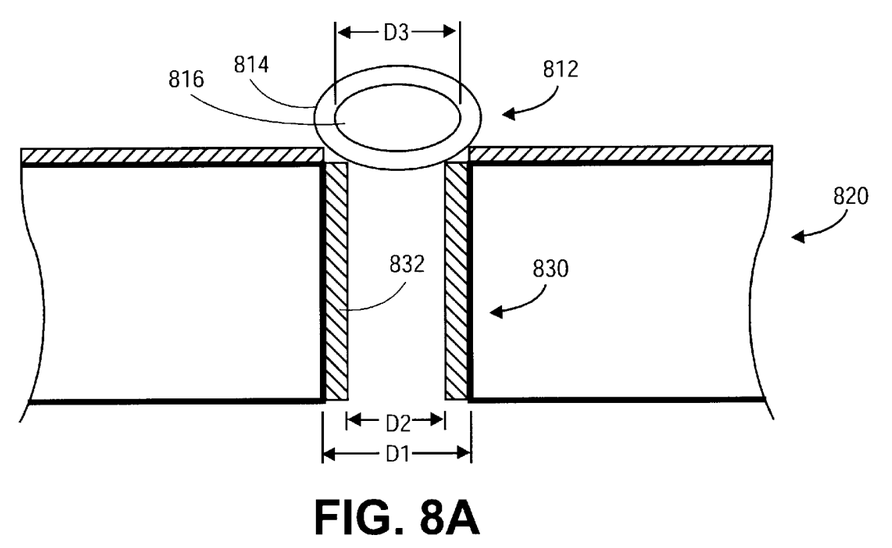
FIG. 8 illustrates a cross-sectional view of a PCB with a padless via with a conductive via plug according to another embodiment of the present invention.

FIG. 8A illustrates a solder ball 812 having a solder shell 814 surrounding a solid center 816. The solder shell 814 may be made of a lead-free solder, for example, having a melting temperature of approximately 410° F., while the center ball may be made of aluminum or copper, having melting temperatures of approximately 1221° F. or 1981° F., respectively. As illustrated, the solid center 816 may have a diameter D3 greater than an inner diameter D2 of a padless via 830 formed in a PCB 820. For example, the padless via 830 may have an inner diameter D2 of 10 mils, while the solid center 816 may have a diameter D3 of 20 mils.

Figure 8B:
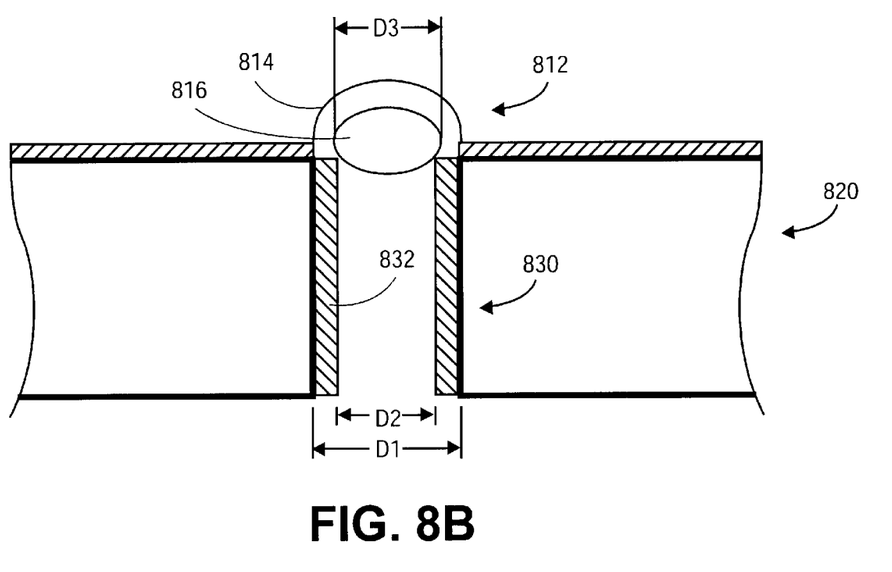

As illustrated in FIG. 8B, the solid center 816 may come in contact with a plating material 832 during reflow of the solder shell 814, which may enhance the electrical connection between the solder ball 812 and the plating material 832 and may prevent solder from wicking into the padless via 830. Solid-centered solder balls may also help achieve a uniform height among solder interconnections after reflow.

Signal Routing Between Adjacent Interconnections

Referring back to FIG. 2, the padless via 230 and adjacent contact pad 234 be formed on a top surface of the PCB 220 as part of an array of interconnections to connect with a corresponding array of contact pads 214 on a bottom surface of the component 210. As illustrated, the contact pads 214 on the bottom surface of the component 210 maybe formed as an array have a substantially uniform pitch P. For example, the component 210 may be a BGA component having a standard BGA pitch, such as 1.5 mm, 1.27 mm or 1.0 mm. Alternatively, the component 210 may be a BGA component having a reduced BGA pitch, such as 0.8 mm, 0.75 mm, 0.6 mm and 0.5 mm.

As previously described, due to a reduced diameter of padless vias, conductive traces may be routed between padless vias and adjacent interconnections for reduced pitch BGA components. For example, as illustrated in FIG. 3, conductive traces 242 and 244 may be routed between adjacent padless vias 230. Assuming adjacent padless vias have a same diameter, "D", a minimum pitch "P" for a component to be attached to the array of interconnections may be determined by the following equation:

$$P=D+N*t+(N-1)*s+2*a$$

where "N" is the number of conductive traces routed between adjacent interconnections, "t" is the trace width, "s" is the space between traces, and "a" is a trace-via spacing. Alternatively, the number of conductive traces N that may be routed between padless vias for a given pitch P may be determined by solving the above equation for N, which yields:

$$N=(P-D-2a+s)/(t+s)$$

If adjacent interconnections, such as a padless vias 230 and the contact pad 234, have differing diameters, D1 and D2, the above equations may be modified by substituting (D1+D2)/2 for D to find the number of conductive traces that may be routed between the adjacent interconnections.

Figure 9:
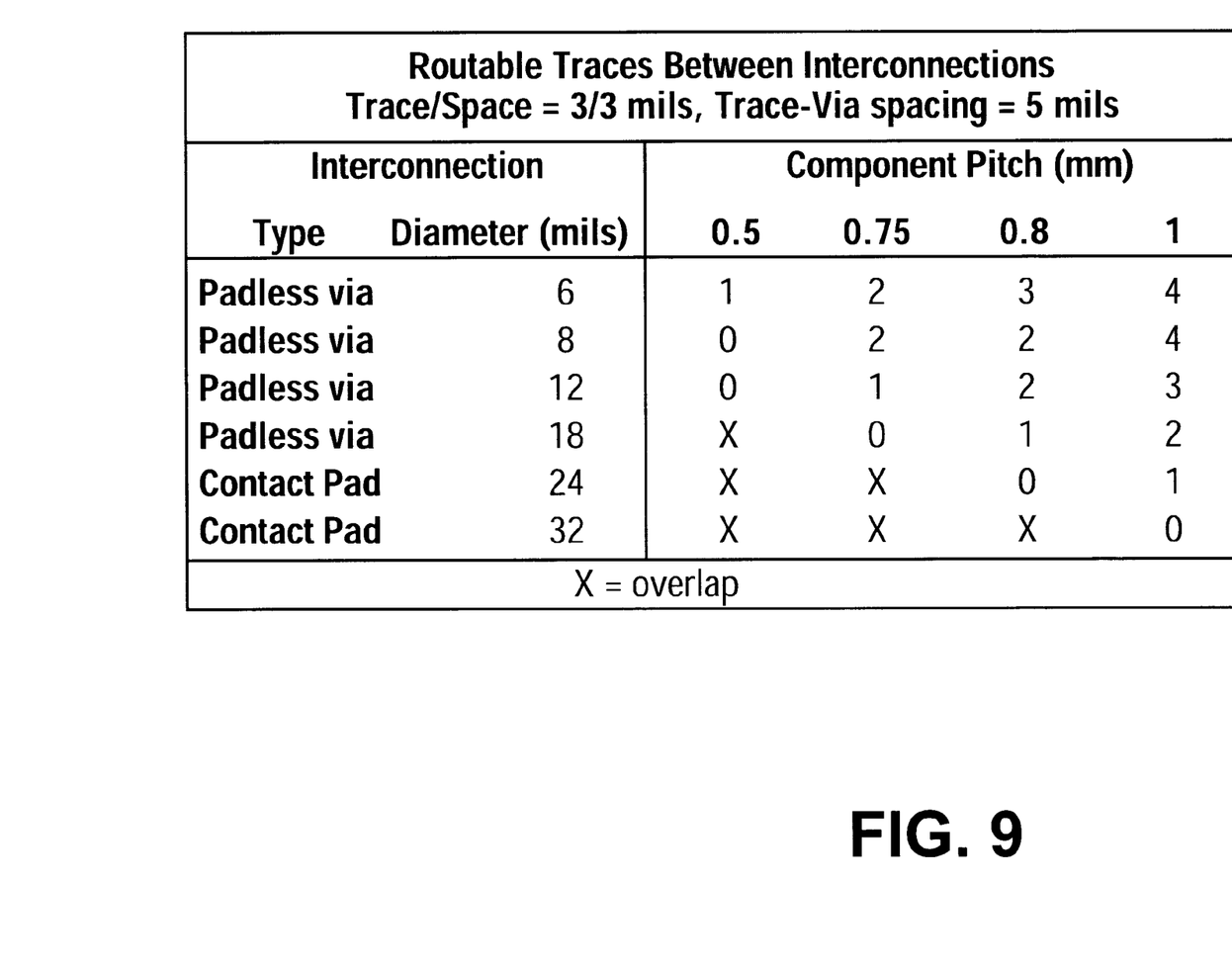
FIG. 9 is a table comparing routable conductive traces between interconnections having different diameters for various component pitches.

FIG. 9 is a table comparing a maximum number of routable conductive traces N between interconnections of varying diameters for component pitches ranging from 0.5 mm (19.7 mils) to 1.0 mm (39.4 mils). The table assumes trace and space widths of 3 mils and trace-via spacing of 5 mils. As illustrated, for a component pitch of 0.8 mm, two conductive traces may be routed between adjacent padless vias having a diameter of 12 mils, while no conductive traces may be routed between traditional vias formed through contact pads having a diameter of 24 mils. Further, contact pads having a diameter of 24 mils or greater overlap for component pitches of 0.75 mm or less.

As previously described, routing conductive traces between adjacent interconnections may reduce a total number of PCB layers needed for interconnection, which may reduce overall PCB cost. Further, by using a standard width for the conductive traces and spaces, such as 3 mils, PCB costs may be further reduced by avoiding complicated and expensive manufacturing processes which may be required for finer width conductive traces and spaces.

In the foregoing description, the invention has been described with reference to specific exemplary embodiments thereof. It will, however, be evident that various modifications and changes may be made thereto without departing from the broader spirit or scope of the appended claims. The specification and drawings are, accordingly, to be regarded in an illustrative rather than a restrictive sense.

What is claimed is:

1. A printed circuit board (PCB) comprising:
   a first signal routing layer formed on a first surface of the PCB;
   an inner second signal routing layer;
   a blind padless via extending from the first signal routing layer to the inner second signal routing layer, the blind padless via in electrical contact with a conductive trace on the inner second signal routing layer; and
   a layer of solder mask material formed over the first signal routing layer, the layer of solder mask material having at least one opening to expose the blind padless via.

2. The PCB of claim 1, further comprising a via plug formed within the blind padless via.

3. The PCB of claim 2, wherein the via plug comprises an electrically conductive material.

4. The PCB of claim 1, further comprising a component attached to the PCB with a solder interconnection between a contact pad on a bottom surface of the component and the blind padless via.

5. A printed circuit board (PCB) comprising:
   a first signal routing layer formed on a first surface of the PCB;
   an electrically conductive layer consisting of at least one of a conductive plane and a second signal routing layer;
   an array of interconnections formed on the first surface of the PCB, the array of interconnections comprising a padless via extending from the first signal routing layer to the electrically conductive layer, wherein the padless via is in electrical contact with the electrically conductive layer; and
   at least two conductive traces formed on the first signal routing layer between the padless via and an adjacent interconnection.

6. The PCB of claim 5, further comprising an electrically conductive via plug formed within the padless via.

7. The PCB of claim 5, wherein the array of interconnections further comprises at least one contact pad electrically coupled with a conductive trace on the first signal routing layer, wherein the at least one contact pad has a diameter less than 18 mils.

8. The PCB of claim 5, wherein the array of interconnections has an array pitch of no more than approximately 0.8 mm.

9. The PCB of claim 8, wherein the at least two conductive traces have a width of approximately 3 mils.

10. The PCB of claim 5, wherein the padless via has a diameter of no more than approximately 12 mils.

11. A system comprising:

a printed circuit board (PCB) comprising a first signal routing layer formed on a first surface of the PCB, an electrically conductive layer consisting of at least one of a conductive plane and a second signal routing layer, and an array of interconnections formed on the first surface of the PCB, wherein the array of interconnections comprises at least one padless via extending from the first signal routing layer to the electrically conductive layer, the at least one padless via electrically connected to the electrically conductive layer; and a component attached to the PCB by a plurality of solder ball interconnections between the array of interconnections formed on the first surface of the PCB and a corresponding array of contact pads disposed on a bottom surface of the component;

wherein the component is a ball grid array (BGA) component having an array pitch of less than approximately 1.0 mm.

12. The system of claim 11, further comprising at least two conductive traces on the first signal routing layer routed between the at least one padless via and an adjacent interconnection.

13. The system of claim 12, wherein a width of the at least two conductive traces is approximately 3 mils.

14. The system of claim 11, wherein the at least one padless via has a diameter of no more than approximately 12 mils.

15. The system of claim 11, wherein the PCB is a motherboard and the component is a processor.

16. A method of fabricating a printed circuit board (PCB) comprising:

forming a first signal routing layer on a first surface of a printed circuit board (PCB); and forming an array of interconnections on the first surface of the PCB, the array of interconnections comprising a blind padless via extending from the first signal routing layer to an inner second signal routing layer, wherein the blind padless via is in electrical contact with a conductive trace on the inner second signal routing layer.

17. The method of claim 16, wherein said forming an array of interconnections on the first surface of the PCB comprises forming an array of interconnections having an array pitch of no more than approximately 0.8 mm.

18. The method of claim 17, further comprising routing at least two conductive traces on the first signal routing layer between the blind padless via and an adjacent interconnection.

19. The method of claim 16, further comprising forming a via plug within the blind padless via.

20. The method of claim 19, wherein said forming a via plug within the blind padless via comprises overplating the blind padless via to form a via plug of plating material.

21. The method of claim 16, wherein said forming an array of interconnections on the first surface of the PCB comprises forming at least one contact pad on the first surface of the PCB adjacent to the blind padless via, the at least one contact pad in electrical contact with a conductive trace on the first signal routing layer.

22. A method of attaching a component to a printed circuit board (PCB) comprising:

aligning solder balls attached to an array of contact pads on a bottom surface of the component with a corresponding array of interconnections formed on a first surface of the PCB, the array of interconnections comprising at least one padless via extending from a first signal routing layer on the first surface of the PCB to an electrically conductive layer consisting of at least one of a conductive plane and a second signal routing layer within the PCB, wherein the at least one padless via is in electrical contact with the electrically conductive layer; and reflowing the solder balls to electrically connect the array of contact pads to the corresponding array of interconnections;

wherein the solder balls comprise a solder shell surrounding a solid center of a material having a higher melting temperature than the solder shell.

23. The method of claim 22, wherein the solder shell comprises a lead-free solder and the solid center is comprises at least one of copper and aluminum.

24. The method of claim 22, wherein the component is an electronic component housed in a ball grid array (BGA) package having a BGA pitch of no more than approximately 0.8 mm.

* * * * *

UNITED STATES PATENT AND TRADEMARK OFFICE
CERTIFICATE OF CORRECTION

PATENT NO. : 6,630,631 B1
DATED : October 7, 2003
INVENTOR(S) : Dishongh et al.

It is certified that error appears in the above-identified patent and that said Letters Patent is hereby corrected as shown below:

Column 8,
Line 8, after "solid center", delete "is".

Signed and Sealed this

Thirteenth Day of January, 2004

JON W. DUDAS
*Acting Director of the United States Patent and Trademark Office*